(12) United States Patent
Su et al.

(10) Patent No.: US 7,737,563 B2
(45) Date of Patent: Jun. 15, 2010

(54) SEMICONDUCTOR CHIP WITH REINFORCEMENT STRUCTURE

(75) Inventors: Michael Su, Round Rock, TX (US); Lei Fu, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 28 days.

(21) Appl. No.: 12/132,734

(22) Filed: Jun. 4, 2008

(65) Prior Publication Data

US 2009/0302427 A1 Dec. 10, 2009

(51) Int. Cl.
*H01L 23/488* (2006.01)
*H01L 21/58* (2006.01)

(52) U.S. Cl. ............... 257/778; 257/786; 257/E21.503; 438/108; 438/126

(58) Field of Classification Search .................. 438/126
See application file for complete search history.

(56) References Cited

U.S. PATENT DOCUMENTS

| | | | |
|---|---|---|---|
| 6,049,124 A * | 4/2000 | Raiser et al. | 257/712 |
| 6,493,229 B2 * | 12/2002 | Akram et al. | 361/704 |
| 2002/0043721 A1 * | 4/2002 | Weber | 257/734 |
| 2006/0278957 A1 | 12/2006 | Lin et al. | |
| 2007/0069336 A1 | 3/2007 | Ning | |
| 2008/0083959 A1 | 4/2008 | Wu et al. | |

OTHER PUBLICATIONS

U.S. Appl. No. 12/388,064, filed Feb. 18, 2009, Michael Z. Su et al.
U.S. Appl. No. 12/388,092, filed Feb. 18, 2009, Michael Su et al.
USPTO Office Action mailed Jul. 9, 2009; U.S. Appl. No. 11/853,122.
Guotao Wang et. al.; *Chip packaging interaction: a critical concern for Cu/low k packaging*; www.sciencedirect.com; Microelectronics Reliability 45 (2005) 1079-1093.
Marie-Claude Paquet et al.; *Underfill Selection Strategy for Pb-Free, Low-K and Fine Pitch Organic Flip Chip Applications*; 2006 Electronic Components and Technology Conference; 1-4244-0152-6/06/ $20.00 © 2006 IEEE; pp. 1595-1603.
John Baliga; *Yet Another Way to Use BCB*; Semiconductor International; http://www.semiconductor.net/article/CA6347341.html; Jul. 1, 2006; pp. 1-3.
U.S. Appl. No. 11/853,122, filed Sep. 11, 2007, Michael Su et al.

* cited by examiner

*Primary Examiner*—Stephen W Smoot
(74) *Attorney, Agent, or Firm*—Ditthavong, Mori & Steiner, P.C.

(57) ABSTRACT

Various semiconductor chip reinforcement structures and methods of making the same are disclosed. In one aspect, a method of manufacturing is provided that includes coupling a semiconductor chip to a substrate wherein the semiconductor chip has a first side facing toward but separated from a second of the substrate to define an interface region. An array of electrical interconnects is provided between the semiconductor chip and the substrate positioned in the interface region. A reinforcement structure is coupled to the first side of the semiconductor chip and the second side of the substrate and in the interface region while outside the array of electrical interconnects. An underfill is provided in the interface region.

27 Claims, 5 Drawing Sheets

SEMICONDUCTOR CHIP WITH REINFORCEMENT STRUCTURE

BACKGROUND OF THE INVENTION

1. Field of the Invention

This invention relates generally to semiconductor processing, and more particularly to semiconductor chip crack stops and to methods of making the same.

2. Description of the Related Art

Conventional semiconductor chips are routinely fabricated en masse in large groups as part of a single semiconductor wafer. At the conclusion of the processing steps to form the individual dice, a so-called dicing or sawing operation is performed on the wafer to cut out the individual dice. Thereafter, the dice may be packaged or directly mounted to a printed circuit board of one form or another. Conventional semiconductor dice are routinely cut out from the wafer as rectangular shapes. By definition, a conventional semiconductor die has four sides and four corners. The dicing operation is a mechanical cutting operation performed with a type of circular saw. Dicing saws are made with great care and operate more precisely than a comparable masonry circular saw. Despite these refinements, the dicing saw still imposes significant stresses on the individual dice as they are cut. These stresses and impact loads during the cutting operation can cause microscopic fractures in the dice, particularly at the die corners. Once the cut dice are mounted to a package substrate or printed circuit board of one sort or another, the cracks introduced during cutting may propagate further into the center of the dice due to thermal stresses and other mechanical stresses that may be placed on the die. In addition, new cracks may form, particularly near the corners which create so-called stress risers by virtue of their geometries.

A conventional technique for addressing the propagation of cracks from the corners of a die involves the use of a crack stop. A conventional crack stop consists of a frame-like structure formed in and near the edges of the semiconductor die. When viewed from above, the crack stop looks like a picture frame. The conventional crack stop does not extend out to the edges of the conventional die. Because of this geometry, a crack propagating from the corner of a die can achieve a significant length before encountering the die crack stop. If the crack achieves a certain critical length before encountering the conventional crack stop, the crack can become virtually uncontrollable. The crack can overwhelm the conventional crack stop and invade the active portion of the semiconductor die and lay waste to the delicate circuit structures positioned therein.

Another issue that can arise for conventional flip-chip mounted semiconductor chips is high solder joint stresses caused by differing thermal strain rates in the chip versus the substrate to which it is attached. In a typical chip mounted to a substrate by a controlled collapse processing, an array of solder joints electrically connects the chip to the underlying substrate. A neutral point, usually though not necessarily located at the center of the chip, represents an area of substantially zero thermal strain. Solder joints in or near this area suffer low strains. However, proceeding outward from the neutral point, the die and underlying substrate begin to exhibit thermal strains that depend on temperature, coefficient of thermal expansion (CTE) and distance from the neutral point. A substrate usually has CTE that is six to seven times larger than the CTE of the chip. The strains are proportional to the distance from the neutral point. Thus, the solder joints near the die edges are subjected to the highest strains. Conventional crack stops provide little in the way of resistance to solder joint strain.

The present invention is directed to overcoming or reducing the effects of one or more of the foregoing disadvantages.

SUMMARY OF THE INVENTION

In accordance with one aspect of the present invention, a method of manufacturing is provided that includes coupling a semiconductor chip to a substrate wherein the semiconductor chip has a first side facing toward but separated from a second of the substrate to define an interface region. An array of electrical interconnects is provided between the semiconductor chip and the substrate positioned in the interface region. A reinforcement structure is coupled to the first side of the semiconductor chip and the second side of the substrate and in the interface region while outside the array of electrical interconnects. An underfill is provided in the interface region.

In accordance with another aspect of the present invention, a method of manufacturing is provided that includes coupling a first reinforcement member to a first side of a semiconductor chip wherein the first side has an array of conductor structures adapted to couple to solder. The first reinforcement member is coupled external to the array of conductor structures. A second reinforcement member is coupled to a first side of substrate. The first side of the semiconductor chip is placed proximate to but separated from the first side of the substrate to define an interface region. The first reinforcement member is bonded to the second reinforcement member and an underfill is provided in the interface region.

In accordance with another aspect of the present invention, an apparatus is provided that includes a substrate that has a first side and a semiconductor chip coupled to the substrate that has a second side facing toward but spaced from the first side of the substrate to define an interface region. The semiconductor chip includes an array of electrical interconnects with the substrate positioned in the interface region. A reinforcement structure is coupled to the first side of the substrate and the second side of the semiconductor chip and positioned in the interface region outside the array of electrical interconnects. An underfill is in the interface region.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
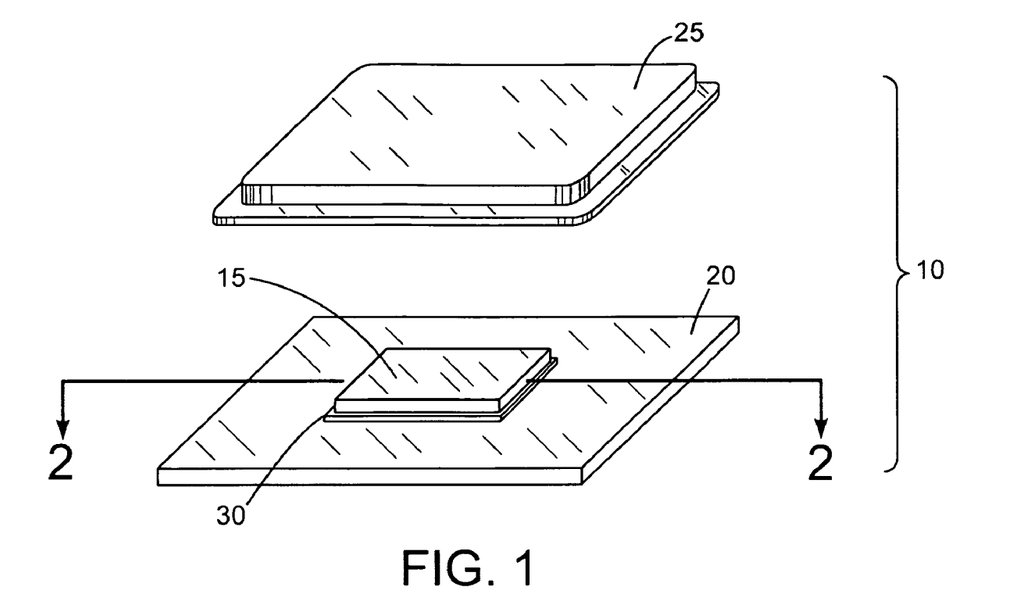
FIG. 1 is a partially exploded pictorial view of an exemplary embodiment of a semiconductor chip package that includes a semiconductor chip mounted on a package substrate.

In the drawings described below, reference numerals are generally repeated where identical elements appear in more than one figure. Turning now to the drawings, and in particular to FIG. 1, therein is shown a partially exploded pictorial view of an exemplary embodiment of a semiconductor chip package 10 that includes a semiconductor chip 15 mounted on a package substrate 20. The package 10 may be provided with a lid 25 that is shown exploded from the package substrate 20. A small portion of an underfill material layer 30 is visible at the periphery of the semiconductor chip 15.

The semiconductor chip 15 may be flip-chip mounted to the substrate 20 as shown and electrically connected to conductors in the substrate 20 by interconnects that are not visible in FIG. 1 but will be shown in subsequent figures. The semiconductor chip 15 may be any of a myriad of different types of circuit devices used in electronics, such as, for example, microprocessors, graphics processors, combined microprocessor/graphics processors, application specific integrated circuits, memory devices or the like, and may be single or multi-core. The semiconductor chip 15 may be fabricated using silicon, germanium or other semiconductor materials. If desired, the chip 15 may be fabricated as a semiconductor-on-insulator substrate or as bulk semiconductor. The semiconductor chip 15 may be electrically interconnected with the substrate 20 by a plurality of conductor structures that are not visible in FIG. 1.

The substrate 20 may be composed of ceramics or organic materials as desired. If organic, the substrate 20 may actually consist of multiple layers of metallization and dielectric materials that electrically interconnect the semiconductor chip 15 to some other component, such as a board (not shown). The substrate 20 may interconnect electrically with external devices, such as another circuit board, in a variety of ways, such as via a pin grid array, a land grid array, a ball grid array or other configuration. The number of individual layers for the substrate 20 is largely a matter of design discretion. In certain exemplary embodiments, the number of layers may vary from four to sixteen. If such a build-up design is selected, a standard core, thin core or coreless arrangement may be used. The dielectric materials may be, for example, epoxy resin with or without fiberglass fill. Of course, the substrate 20 could be configured as something other than a package substrate, such as a printed circuit board serving as a motherboard, a daughter board, a card or some other type of board.

The underfill material 30 is designed to lessen the effects of differences in CTE between the chip 15 and the substrate 20. The underfill material 30 may be composed of well-known epoxy materials, such as epoxy resin with or without silica fillers and phenol resins or the like.

The optional lid 25 may be configured as a top hat design as disclosed, as a bathtub design or some other configuration. The lid 25 may be composed of well-known plastics, ceramics or metallic materials as desired. Some exemplary materials include nickel plated copper, anodized aluminum, aluminum-silicon-carbon, aluminum nitride, boron nitride or the like. The lid 25 may be secured to the substrate 20 by an adhesive composed of a well-known thixotropic adhesive or other well-known type of package adhesive as desired. However, the lid 25 may be omitted entirely if a lidless design is desired.

Figure 2:
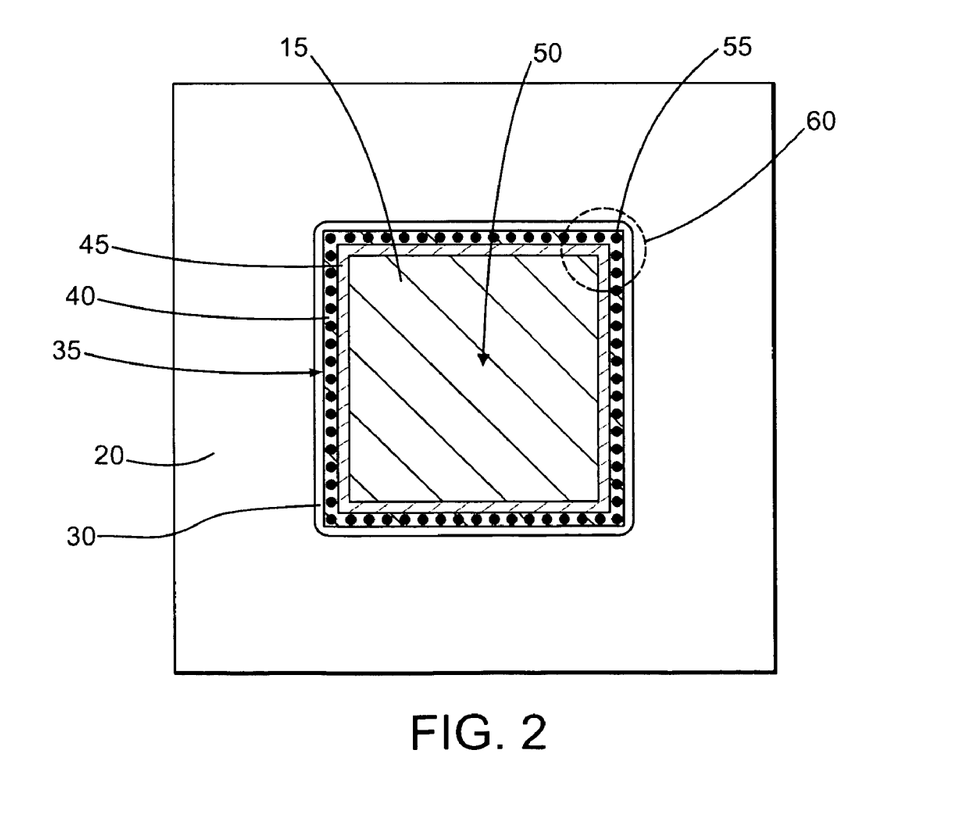
FIG. 2 is a sectional view of FIG. 1 taken at section 2-2.

Additional details of the semiconductor chip 15 may be understood by referring now to FIG. 2, which is a sectional view of FIG. 1 taken at section 2-2. Before considering FIG. 2 in detail, it should be noted that section 2-2 passes through the chip 15 but not through the underlying substrate 20. With that back drop, attention is now turned to FIG. 2. Proceeding from left to right, FIG. 2 depicts the substrate 20, the underfill material 30, the edge 35 of the chip 15, a reinforcement region 40, a crack stop region 45 and an interior portion 50 of the chip 15. The reinforcement region 40 includes a reinforcement structure that in this embodiment consists of a plurality of pillars spaced apart around a periphery of the chip 15. One of the pillars is labeled 55. As a group, the pillars are too small to be practically depicted with cross-sectioning, and thus are simply shown as black circles. The second crack stop region 45 may consist of a conventionally fabricated picture frame style crack stop structure fabricated from more sets of multiple level metal interconnect structures that may be patterned at the same time as other conductor structures in the chip 15. The purpose of both the reinforcement region 40 and the crack stop region 45 is to protect the interior portion 50 of the chip from cracks that may propagate from the edge 35 into the interior 50 where the critical circuit structures of the chip 15 are positioned. A small portion of the package 10 is circumscribed by a dashed circle 60. The portion circumscribed by the dashed circle 60 will be shown at much greater magnification in FIG. 3 so that additional features of the reinforcement region 40 and the crack stop region 45 may be illustrated.

Figure 3:
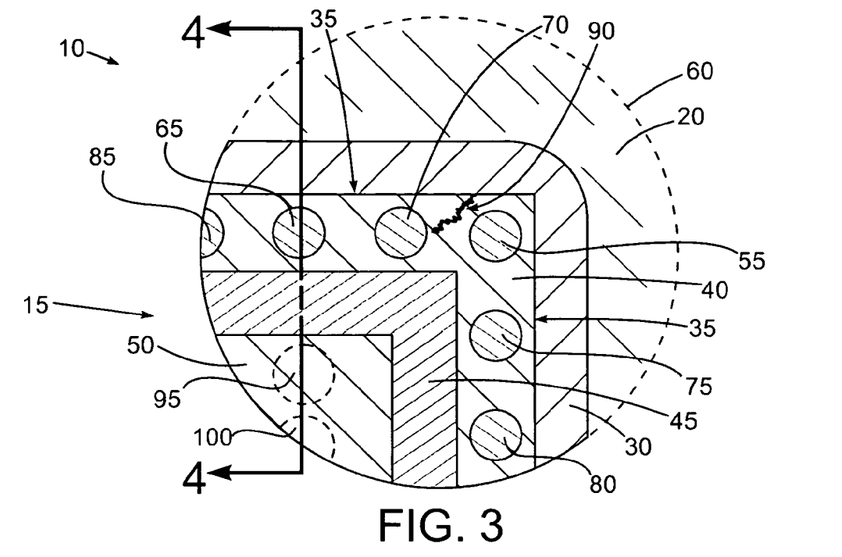
FIG. 3 is a portion of FIG. 2 shown at greater magnification.

Attention is now turned to FIG. 3, which as just noted, is a magnified view of the portion of the package 10 circumscribed by the dashed circle 60. The dashed circle 60 encompasses a small portion of the substrate 20, as well as portions of the underfill material layer 30, the reinforcement region 40, the crack stop region 45 and the interior portion 50 of the semiconductor chip 15. The following description of the reinforcement region 40 and the crack stop region 45 will be illustrative of the remainder of the semiconductor chip 15. The reinforcement region 40 extends from the edge 35 of the chip 15 inward to the second crack stop region 45. A few of the reinforcement pillars 55, 65, 70, 75, 80 and 85 are visible. Both the reinforcement region 40 and the crack stop region 45 are designed to prevent the propagation of cracks, for example, the crack 90 that typically forms near the edge 35 of the chip 15 and propagates inward towards the internal region 50 of the chip 15. However, the reinforcement region 40 fulfills an additional role as described below. The crack stop structures 55, 65, 70, 75, 80 and 85 may be fabricated from a variety of materials and a variety of geometries. In this illustrative embodiment, the structures 55, 65, 70, 75, 80 and 85 are configured as cylindrical pillars. The representation of the crack stop region 45 is somewhat schematic in FIG. 3. In actual practice, the crack stop region 45 may consist of a plurality of vias and interlevel dielectric layers stacked along an axis projecting out of the page.

The chip 15 is electrically interconnected with the substrate 20 by way of a plurality of interconnects, two of which are depicted as dashed circles 95 and 100 since they are positioned beneath the central region 50 of the chip 15 and thus not shown in section. The interconnects 95 and 100 are part of an array of interconnects between the semiconductor chip 15 and the substrate 20 that may number into the hundreds or even thousands. The array of interconnects may be regular or irregular in shape and spacing. The description of the interconnects 95 and 100 herein will be illustrative of the remainder of the semiconductor chip 15.

Figure 4:
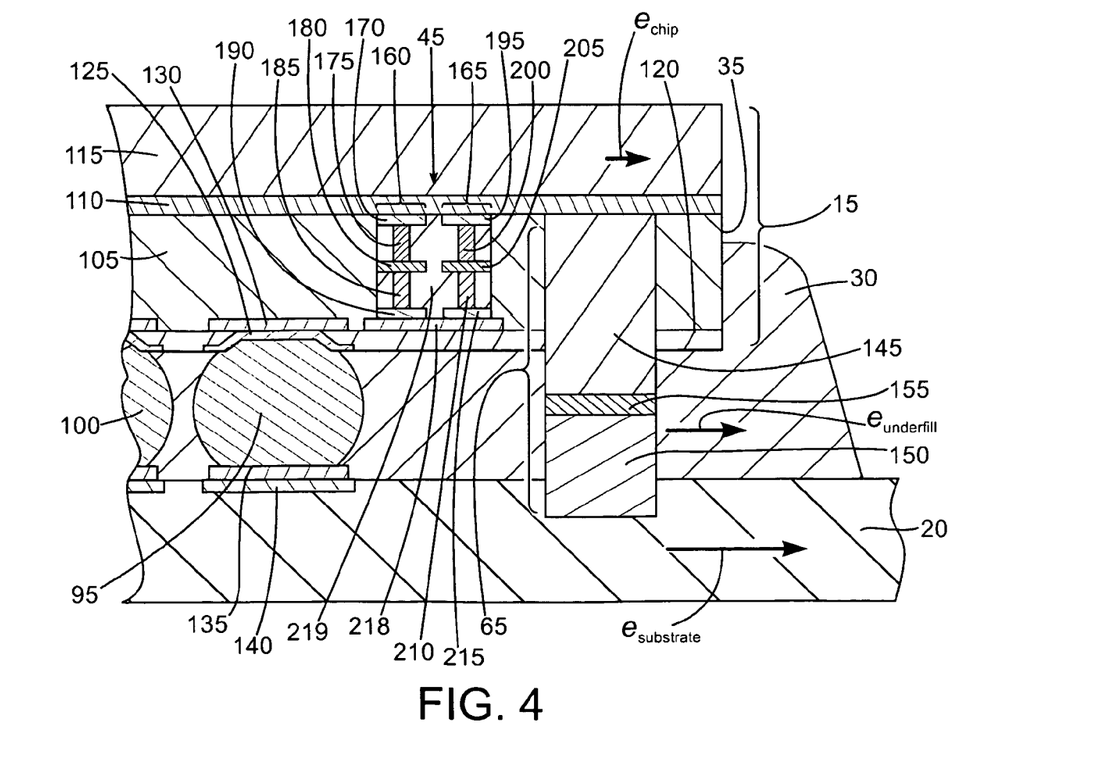
FIG. 4 is a sectional view of FIG. 3 taken at section 4-4.

Additional detail of the crack stop regions 40 and 45 may be understood by referring now to FIG. 4, which is a sectional view of FIG. 3 taken at section 4-4. Before turning to FIG. 4 in detail, it should be remembered that section 4-4 passes through the reinforcement pillar structure 65, as well as the interconnects 95 and 100. With that background, attention is now turned to FIG. 4. The semiconductor chip 15 may be configured as a semiconductor-on-insulator configuration in which a semiconductor layer 105 is stacked on an insulating layer 110. The semiconductor layer 105 contains the active circuitry for the chip 15. The insulating layer 110 is stacked on a bulk silicon or semiconductor layer 115. A passivation/insulating layer 120 may be formed on the semiconductor region 105 and be composed of polyimide or other suitable passivation layer materials.

The interconnect 95 may consist of a solder joint that is metallurgically bonded to a conductor structure or under bump metallization layer (UBM) 125 that is formed in the passivation layer 120. The UBM layer 125 is, in turn, metallurgically connected to a bump pad 130 in the semiconductor layer 105. In terms of function, the UBM layer 125 is designed to prevent diffusion of constituents of the pad 130 into the solder joints 95. The chip 15 includes an array of such conductor structures or UBM structures 125 to accommodate plural solder joints. In an exemplary embodiment where copper is used as the material for the pad 130, the UBM 125 may consist of a stack of chrome, copper and nickel deposited by physical vapor deposition or other well-known techniques. The bump pad 130 may be composed of copper, gold, silver, combinations of these or the like. On the opposite side, the joint 95 is metallurgically bonded to a bump pad 135 that is in turn connected to another pad 140. The pads 135 and 140 may be composed of nickel, gold, copper, silver, palladium combinations of these or the like. The joint 100 may have the same configuration, however, the separate elements of the joint 100 are not separately labeled for simplicity of illustration. The pad 130 is electrically connected to other portions of the chip 15 by way of conductor structures that are not visible. The same is true for the pad 140 albeit in the context of conductor structures that are in the substrate 20. In another embodiment, the interconnects 95 and 100 may consist of conductive pillars of copper, silver, gold, aluminum, combinations of these or the like tied to the chip 15 and the substrate 20 by solder.

In this illustrative embodiment, the reinforcement pillar 65 is configured as a cylindrical pillar that may consist of a portion 145 and a portion 150 joined by a bonding material 155. The portion 145 projects out of the chip 15 some distance and into the chip 15 near or to the insulating layer 110 as shown. The portion 150 projects some distance out of the substrate 20 and some distance into the substrate 20. The reinforcement pillar 65 serves two roles: (1) to prevent cracks from propagating into the interior portion 50 (see FIG. 3) of the chip 15; and (2) to resist strains imposed on the solder joints 95 and 100 by the differential thermal expansion rates of the substrate, the underfill 30 and the chip 15. The typical CTE's of a silicon chip, an underfill and an organic substrate are about 3.0 ppm/° C., about 30.0 ppm/° C. and about 18.0 to 20.0 ppm/° C., respectively. Hypothetical strains in the substrate 20, the underfill 30 and the chip 15 are represented schematically by the vectors $e_{substrate}$, $e_{underfill}$ and $e_{chip}$, respectively. The strains in the substrate 20 and the chip 15 are not constant, but instead tend to increase from nearly zero at the geometric center of the chip 15 to a maximum at the edges 35 of the chip 15 in what is termed the "edge effect." The relatively large difference in strains between $e_{substrate}$ and $e_{chip}$ is partially resisted by the underfill 30. However, the reinforcement pillar 65 provides additional mechanical strength to provide protection for the solder joints 95 and 100.

The portions 145 and 150 may be composed of a variety of materials. Some desirable properties include mechanical strength to resist stresses associated with differential thermal expansion and crack propagation, thermal expansion properties that do not mismatch those of the chip 15 and the substrate 20, and ease of manufacture. Exemplary materials include copper, aluminum, gold, silver, palladium, platinum, combinations of these or the like. Another potential material is carbon nanotubes in an epoxy matrix. The bonding material 155 may be a solder, such as tin-silver, tin-gold or tin-silver-gold, a metal such as gold or even a polymer such as epoxy or benzocyclobutene.

As noted above, the interconnects 95 and 100 may be part of an array. The reinforcement pillar 65 is positioned outside the array. However, if an outer population of interconnects, such as an outermost row that would include, for example, the interconnect 95, are configured as dummy interconnects, then the reinforcement pillar 65 could possibly be positioned further from the die edge 35 than the dummies.

As noted elsewhere herein, the crack stop region 45 may consist of well-known collections of multi-layer conductor structures, two of which are shown and labeled 160 and 165 and each of which consists of multiple conductor structures 170, 175, 180, 185, 190, 195, 200, 205, 210 and 215. The crack stop structure 45 may be capped with a bump pad 218 that is structurally similar to and fabricated at the same time as the bump pad 130. The conductor structures 170, 175, 180, 185, 190, 195, 200, 205, 210 and 215 may be interspersed in a dielectric 219 that may be multi-level, but is shown as a single structure for simplicity of illustration.

Figure 5:
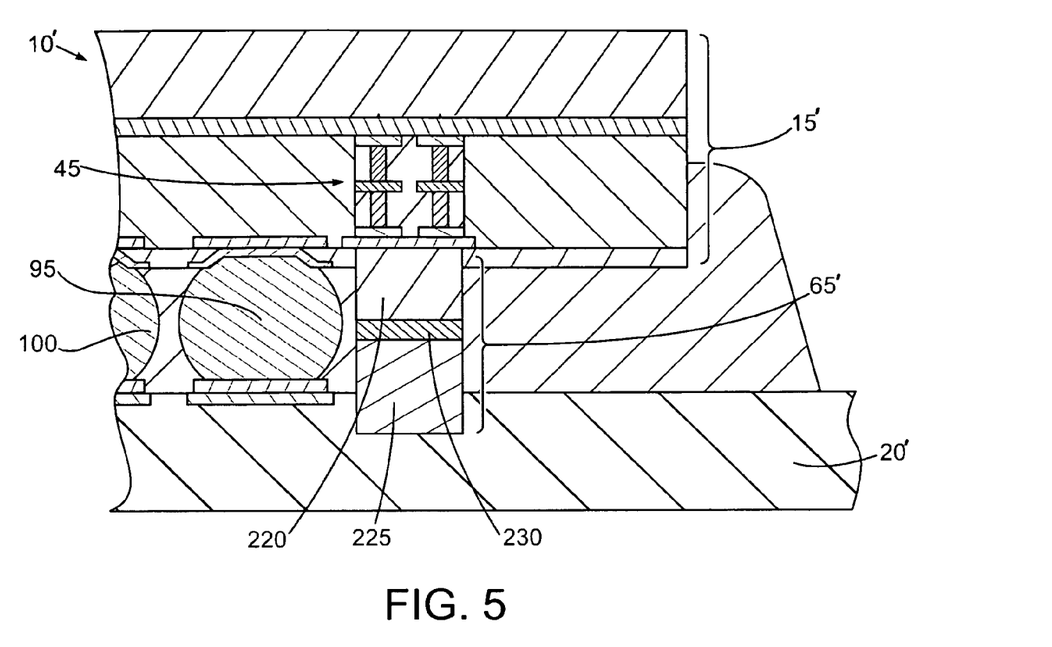
FIG. 5 is a sectional view like FIG. 4 but of alternate exemplary embodiment.

An alternate exemplary embodiment of a package 10' for a chip 15' may be understood by referring now to FIG. 5, which is a sectional view like FIG. 4. In this illustrative embodiment, the solder joints 95 and 100 as well as the crack stop region 45 may be configured as generally described elsewhere herein. However, a reinforcement structure consisting of a plurality of reinforcement pillars, one of which is shown in section and labeled 65', may be provided positioned beneath as opposed to lateral to the crack stop region 45. The reinforcement pillar 65' may be composed of an upper portion 220 coupled to the chip 15' and a lower portion 225 coupled to a substrate 20' where the two are joined by a bonding material layer 230. The portions 220 and 225 and the bonding material 230 may be configured as generally elsewhere herein with regard to the other embodiments.

Figure 6:
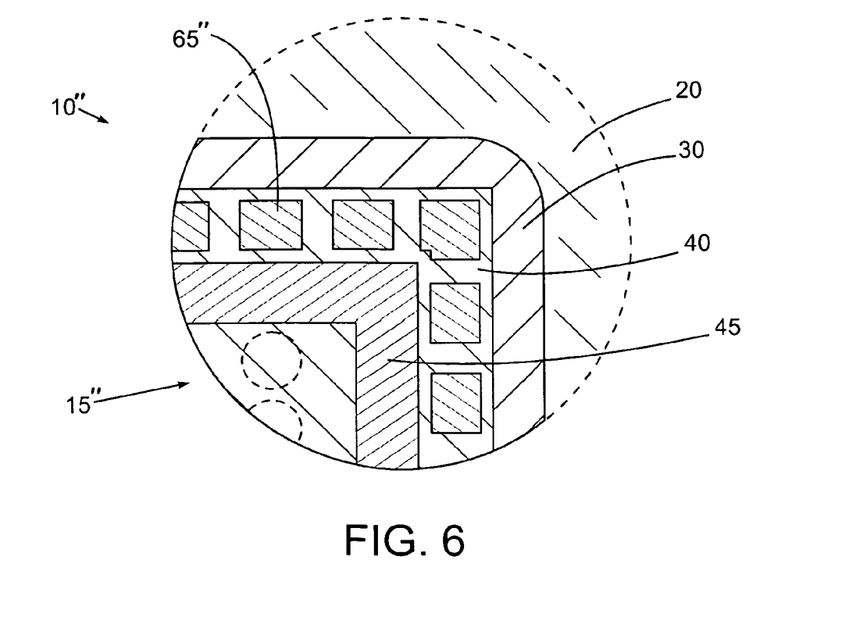
FIG. 6 is a sectional view like FIG. 3, but of another alternate exemplary embodiment.

Another alternate exemplary embodiment of a package 10" for a chip 15" may be understood by referring now to FIG. 6, which is a magnified sectional view like FIG. 3. In this illustrative embodiment, the substrate 20, the underfill material layer 30, the crack stop region 45 may be configured as generally disclosed elsewhere herein. However, in this illustrative embodiment, the reinforcement region 40 may be populated with a plurality of rectangularly or even square-shaped reinforcement pillars, one of which is labeled 65", that collectively make up a reinforcement structure. Along a vertical axis coming in and out of the paper, the crack stop member(s) 65" may be configured as generally described elsewhere herein, where upper and lower portions are joined by a bonding layer.

Figure 7:
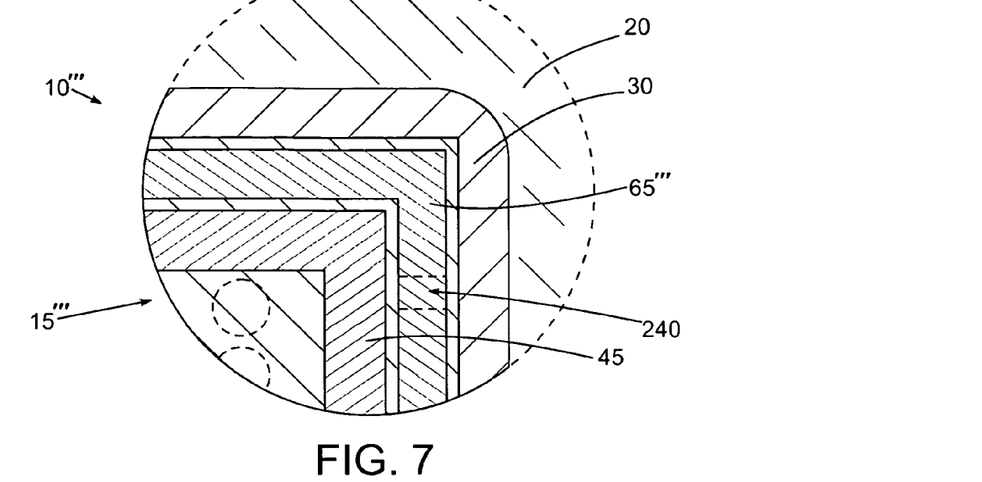
FIG. 7 is a sectional view like FIG. 6, but of another alternate exemplary embodiment.

Another exemplary embodiment of a package 10''' may be understood by referring now to FIG. 7, which is a magnified sectional view like FIG. 3. In this illustrative embodiment, the substrate 20, the underfill material layer 30 and the crack stop region 45 of chip 15''' may be configured as generally described elsewhere herein. However, in this embodiment, the reinforcement region 40 may include a reinforcement structure in the form of a member or ring 65''' that encompasses the entire periphery or almost the entire periphery of the chip 15'''. In this respect, the reinforcement ring 65''' may resemble a fortress wall. If desired, a gap 240 (shown in dashed) in the ring 65''' may provide for out gassing during the curing of the underfill material 30 as well as to facilitate the movement of the underfill material 30 into the interface between the chip 15''' and substrate 30. The reinforcement ring 65''' may be configured as a top portion and bottom portion joined by a bonding material layer as generally described elsewhere herein in conjunction with the embodiment of FIGS. 3, 5 and 6, albeit in the context of an upper ring that is coupled to the chip 15''', a lower ring that is coupled to the substrate 20 and a bonding material layer to join the upper and lower rings.

Figure 8:
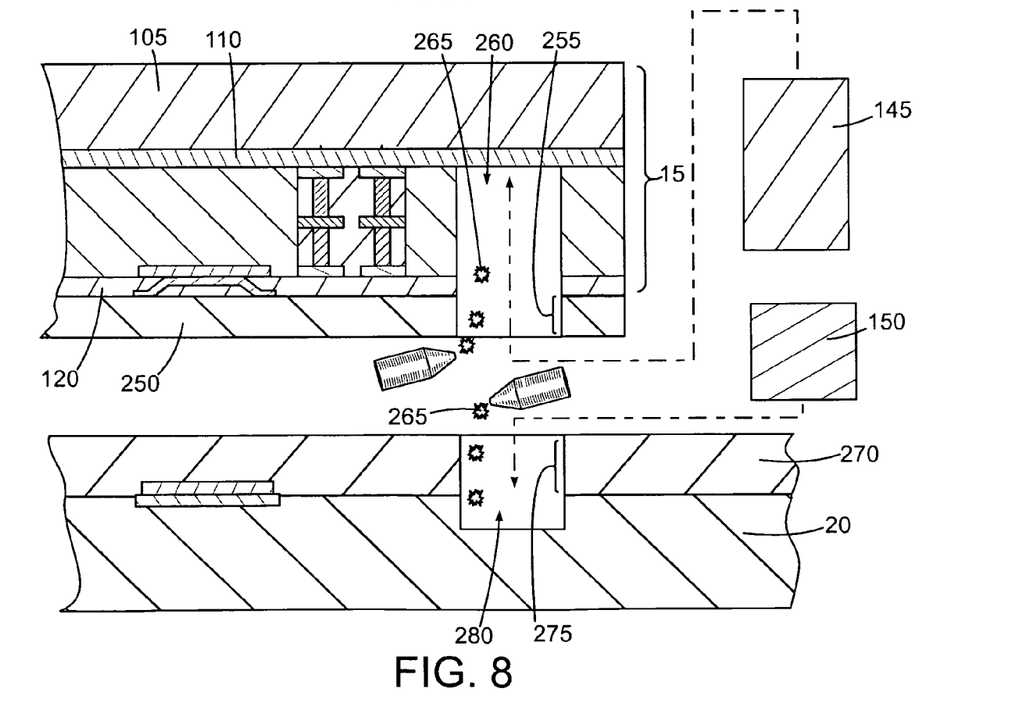
FIG. 8 is a sectional view illustrating exemplary steps to fabricate a chip reinforcement structure.

An exemplary method for establishing the reinforcement region 40 depicted in FIGS. 2 and 3 may be understood by referring now to FIGS. 8, 9 and 10. FIG. 8 is a sectional view not unlike FIG. 4, but depicts the chip 15 positioned above the substrate 20. The techniques may be applied on the entirety of the chip 15. It should be understood that FIG. 8 is somewhat artificial in that the chip 15 will actually be flipped over 180° from the orientation depicted in FIG. 8 during the initial fabrication steps to form the crack stop structure to be described more fully below. However, for continuity of illustration, the chip 15 is shown flipped over relative to the substrate 20. At this stage of processing, the chip 15 is already fitted with the crack stop region 45 as well as the under bump metallization 125 and the bump pad 130. These steps may be performed at the wafer level. A stencil or lithography mask 250 is applied to the chip 15 and patterned with an opening 255 that has the same footprint as either one of the plurality of reinforcement pillars, for example 55, 65, etc. depicted in FIGS. 3 and 4 or a reinforcement ring as the ring 65''' depicted in the embodiment of FIG. 7. If the stencil 250 is composed of resist, then well-known lithography techniques may be used to pattern the opening 255. If the stencil or mask 250 is of other than resist, then well-known techniques may be used to pattern the opening 255. Following the formation of the stencil 250 and the opening 255, an opening 260 may be formed through the polyimide layer 120 and into the semiconductor layer 105. The opening 260 may extend to the insulating layer 110 as shown if desired. The opening 260 may be fabricated by deep trench etching, laser drilling, mechanical drilling or other material removal techniques. Following the fabrication of the opening 260, a plating process or other material deposition process may be used to form the portion 145 that will eventually be joined with the portion 150. If copper is used for the portion 145, a seeding layer composed of a seed material 265 may be deposited in the opening 260. An exemplary seeding material suitable for copper may be tantalum nitride, tantalum or a mixture of the two.

Similar procedures may be followed to fabricate the lower portion 150. In this regard, a stencil or lithography mask 270 may be fabricated on the substrate 20 and patterned with an opening 275 that has the desired foot print for the subsequently formed portion 150. The same types of techniques used to form the opening 275 may be used to form both the opening 275 and the subsequent hole 280 in the substrate 20 as described above in conjunction with the openings 255 and 260 in the stencil 250 and the semiconductor layer 105. Following the fabrication of the openings 275 and 280, the portion 150 may be formed therein by plating or other material deposition processes. Again, if copper is used for the portion 150, a seed layer composed of the seed material 265 may be initially deposited in the opening 280. Attention is now turned to FIG. 9, at this stage, the portions 145 and 150 are in place. A bonding material layer 155 may be applied to the portion 150 or optionally to the portion 145 or both if desired. A solder bump 285 may be applied to the under bump metallization 125 and another solder bump 290 may be applied to the bump pad 140. The bumps 285 and 290 will be joined during a subsequent reflow process to establish the solder joint described elsewhere herein. A variety of materials may be suitable for the bumps 285 and 290. Lead-based or lead-free solders represent two examples. In an exemplary process, a high lead solder such as (97 Pb 3 Sn) may be used for the bump 285 and a eutectic tin lead solder combination may be used for the bump 290.

Figure 9:
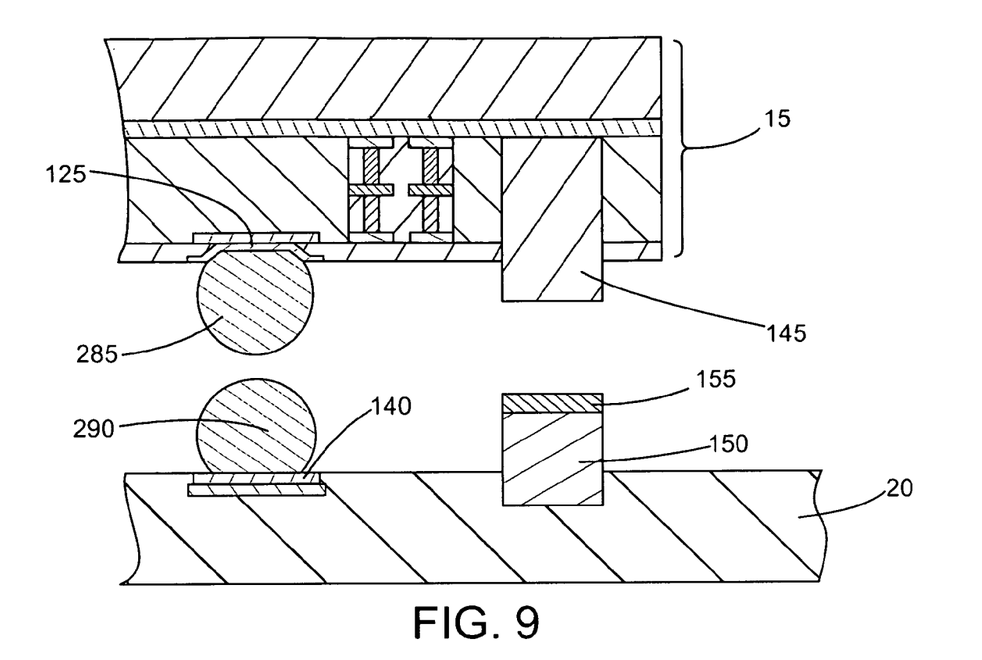
FIG. 9 is a sectional view like FIG. 8 depicting additional exemplary steps to fabricate a chip reinforcement structure.
Figure 10:
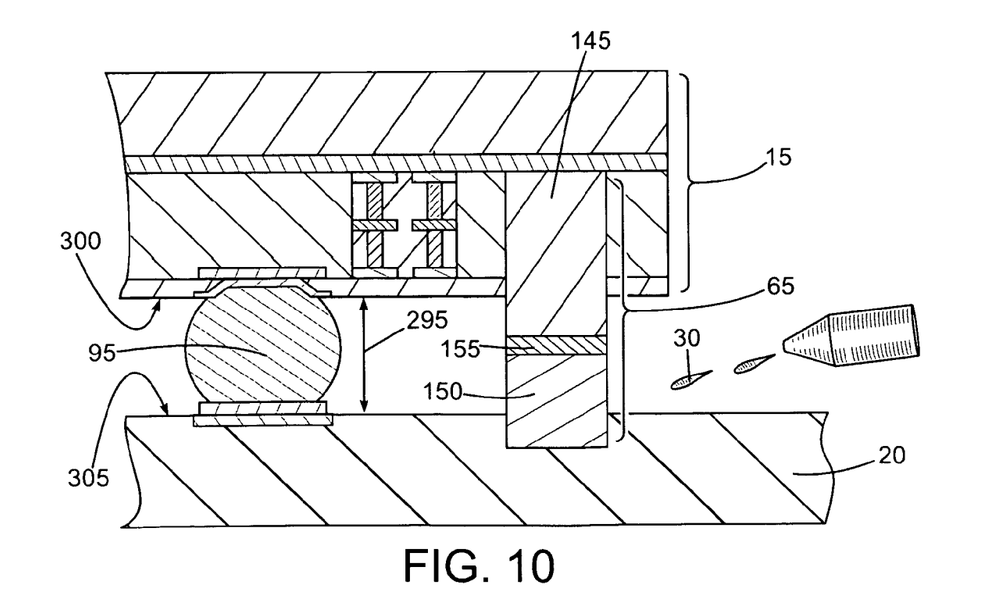
FIG. 10 is a sectional view like FIG. 9 depicting additional exemplary steps to fabricate a chip reinforcement structure.

In this regard, attention is now turned to FIG. 10, which depicts the chip 15 moved into position relative to the substrate 20 so that an interface region 295 between a side 300 of the chip 15 and a side 305 of the substrate 20 is established in which the solder bumps 285 and 290 depicted in FIG. 9 could join metallurgically by way of a controlled collapse and reflow process to establish the solder joint 95 as part of a larger array of interconnects. In addition, the portions 145 and 150 are brought together such that the bonding material layer 155 joins the portions 145 and 150 together to form the completed reinforcement pillar 65. At this stage, the portion 145 and the similar portions formed about the periphery of the chip 15 collectively constitute a reinforcement member, and the portion 150 and the similar portions formed on the substrate 20 collectively constitute a reinforcement member. The same would be true if mating rings were used in lieu of a pillars. At this point, the underfill material 30 may be deposited at the interface 295 and capillary action may be used to spread the underfill through the interface 295. Optionally, a flowless underfill process may be used in which the underfill material is deposited on the substrate 20 prior to the bumping to establish a solder joint 95.

The same general techniques described above in conjunction with FIGS. 8, 9 and 10 may be applied for the other embodiments, even if the reinforcement pillar is fitted beneath the existing crack stop region 45 as depicted for example in the embodiment of FIG. 5. That is, stenciling and/or lithography masking followed by appropriate etching of both the chip 15' and the substrate 20' may be followed by a subsequent joining process.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:

coupling a semiconductor chip to a substrate, the semiconductor chip having a first side facing toward but separated from a second side of the substrate to define an interface region;

providing an array of electrical interconnects between the semiconductor chip and the substrate positioned in the interface region, wherein the semiconductor chip comprises a crack stop region external to the array of electrical interconnects;

coupling a reinforcement structure to the first side of the semiconductor chip and the second side of the substrate and in the interface region while outside the array of electrical interconnects; and providing an underfill in the interface region.

2. The method of claim 1, wherein the providing the array of electrical interconnects comprises forming an array of solder joints.

3. The method of claim 1, wherein the coupling the reinforcement structure comprises forming a plurality of pillars spaced apart about a periphery of the semiconductor chip.

4. The method of claim 3 wherein the forming of the plurality of pillars comprises forming a first plurality of pillars in attachment with the semiconductor chip, forming a second plurality of pillars in attachment with the substrate and coupling the first plurality of pillars to the second plurality of pillars.

5. The method of claim 4, comprising using a bonding material to join the first and second pluralities of pillars.

6. The method of claim 1, wherein the coupling the reinforcement structure comprises forming a ring about a periphery of the semiconductor chip.

7. The method of claim 6, wherein the forming of the ring comprises forming a first ring in attachment with the semiconductor chip, forming a second ring in attachment with the substrate and coupling the first ring to the second ring.

8. The method of claim 1, wherein the reinforcement structure comprises a metallic structure.

9. The method of claim 1, comprising coupling the reinforcement structure external to the crack stop region.

10. The method of claim 1, comprising coupling the reinforcement structure to the crack stop region.

11. A method of manufacturing, comprising:
coupling a first reinforcement member to a first side of a semiconductor chip, the first side having an array of conductor structures adapted to couple to solder, the first reinforcement member being coupled external to the array of conductor structures, wherein the semiconductor chip comprises a crack stop region external to the array of conductor structures;
coupling a second reinforcement member to a first side of substrate;
placing the first side of the semiconductor chip proximate but separated from the first side of the substrate to define an interface region and bonding the first reinforcement member to the second reinforcement member; and
providing an underfill in the interface region.

12. The method of claim 11, comprising forming an array of electrical interconnects in contact with the array of conductor structures and the substrate.

13. The method of claim 11, wherein the coupling the first reinforcement member comprises forming a first plurality of pillars spaced apart about a periphery of the semiconductor chip, the coupling the second reinforcement member comprises forming a second plurality of pillars on the substrate, and the bonding comprises bonding corresponding of the first and second pluralities of pillars.

14. The method of claim 13, comprising using a bonding material to join the first and second pluralities of pillars.

15. The method of claim 11, wherein the coupling the first reinforcement structure comprises forming a first ring about a periphery of the semiconductor chip, the coupling the second reinforcement member comprises coupling a second ring to the substrate, and the bonding comprises bonding the first and second rings.

16. The method of claim 11, wherein the reinforcement structure comprises a metallic structure.

17. The method of claim 11, comprising coupling the first reinforcement member external to the crack stop region.

18. The method of claim 11, comprising coupling the first reinforcement member to the crack stop region.

19. An apparatus, comprising:
a substrate having a first side;
a semiconductor chip coupled to the substrate and having a second side facing toward but spaced from the first side of the substrate to define an interface region, the semiconductor chip including an array of electrical interconnects with the substrate positioned in the interface region, wherein the semiconductor chip comprises a crack stop region external to the array of electrical interconnects;
a reinforcement structure coupled to the first side of the substrate and the second side of the semiconductor chip and being positioned in the interface region outside the array of electrical interconnects; and
an underfill in the interface region.

20. The apparatus of claim 19, wherein the array of electrical interconnects comprises an array of solder joints.

21. The apparatus of claim 19, wherein the reinforcement structure comprise a plurality of pillars spaced apart about a periphery of the semiconductor chip.

22. The apparatus of claim 21, wherein the each of the plurality of pillars comprises a first portion coupled to the semiconductor chip and a second portion coupled to the substrate and the first portion.

23. The apparatus of claim 19, wherein the reinforcement structure comprises a ring about a periphery of the semiconductor chip.

24. The apparatus of claim 23, wherein the ring comprises a first ring in attachment with the semiconductor chip, a second ring in attachment with the substrate and coupled to the first ring.

25. The apparatus of claim 19, wherein the reinforcement structure comprises a metallic structure.

26. The apparatus method of claim 19, wherein the reinforcement structure is coupled external to the crack stop region.

27. The apparatus of claim 19, wherein the reinforcement structure is coupled to the crack stop region.

* * * * *